(12) United States Patent
Nakanishi et al.

(10) Patent No.: US 11,563,019 B2
(45) Date of Patent: Jan. 24, 2023

(54) SEMICONDUCTOR STORAGE DEVICE AND ELECTRONIC APPARATUS

(71) Applicant: Seiko Epson Corporation, Toyko (JP)

(72) Inventors: Hiroyuki Nakanishi, Chino (JP); Susumu Akaishi, Chino (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/340,230

(22) Filed: Jun. 7, 2021

(65) Prior Publication Data

US 2021/0384199 A1 Dec. 9, 2021

(30) Foreign Application Priority Data

Jun. 8, 2020 (JP) .............................. JP2020-099179

(51) Int. Cl.
| | |
|---|---|
| *H01L 27/11* | (2006.01) |
| *H01L 27/1156* | (2017.01) |
| *H01L 27/11524* | (2017.01) |
| *G11C 16/10* | (2006.01) |
| *G11C 16/04* | (2006.01) |
| *H01L 29/78* | (2006.01) |

(52) U.S. Cl.
CPC ...... *H01L 27/1156* (2013.01); *G11C 16/0441* (2013.01); *G11C 16/10* (2013.01); *H01L 27/11524* (2013.01); *H01L 29/7841* (2013.01)

(58) Field of Classification Search
None
See application file for complete search history.

(56) References Cited

U.S. PATENT DOCUMENTS

| | | | |
|---|---|---|---|
| 2002/0021585 A1 | 2/2002 | Maeda et al. | |
| 2006/0018161 A1* | 1/2006 | Chen | G11C 16/0441 |
| | | | 257/E27.103 |
| 2006/0244041 A1* | 11/2006 | Tanaka | G11C 16/0433 |
| | | | 257/E21.691 |
| 2009/0207642 A1 | 8/2009 | Shimano et al. | |
| 2012/0224419 A1 | 9/2012 | Inaba | |
| 2016/0071598 A1* | 3/2016 | La Rosa | G11C 16/10 |
| | | | 365/185.05 |
| 2017/0229471 A1* | 8/2017 | Kim | G11C 16/14 |

FOREIGN PATENT DOCUMENTS

| | | |
|---|---|---|
| JP | 2009-016646 A | 1/2009 |
| JP | 2009-259193 A | 11/2009 |
| JP | 2010-024508 A | 2/2010 |
| JP | 2012-028790 A | 2/2012 |
| JP | 2012-182369 A | 9/2012 |
| JP | 2019-096756 A | 6/2019 |

\* cited by examiner

*Primary Examiner* — Tan T. Nguyen
(74) *Attorney, Agent, or Firm* — Harness, Dickey & Pierce, P.L.C.

(57) ABSTRACT

In a semiconductor storage device including a plurality of memory cells formed at a laminated substrate including a support layer, an insulating layer on the support layer, and a semiconductor layer on the insulating layer, the plurality of memory cells each include a floating gate transistor and a selection transistor. The floating gate transistor includes a first source region, a first drain region, a first body region, a first body contact region, a floating gate insulating film, and a floating gate electrode, and the selection transistor includes a second source region, a second drain region, a second body region, a second body contact region insulated from the first body contact region, a selection gate insulating film, and a selection gate electrode.

7 Claims, 10 Drawing Sheets

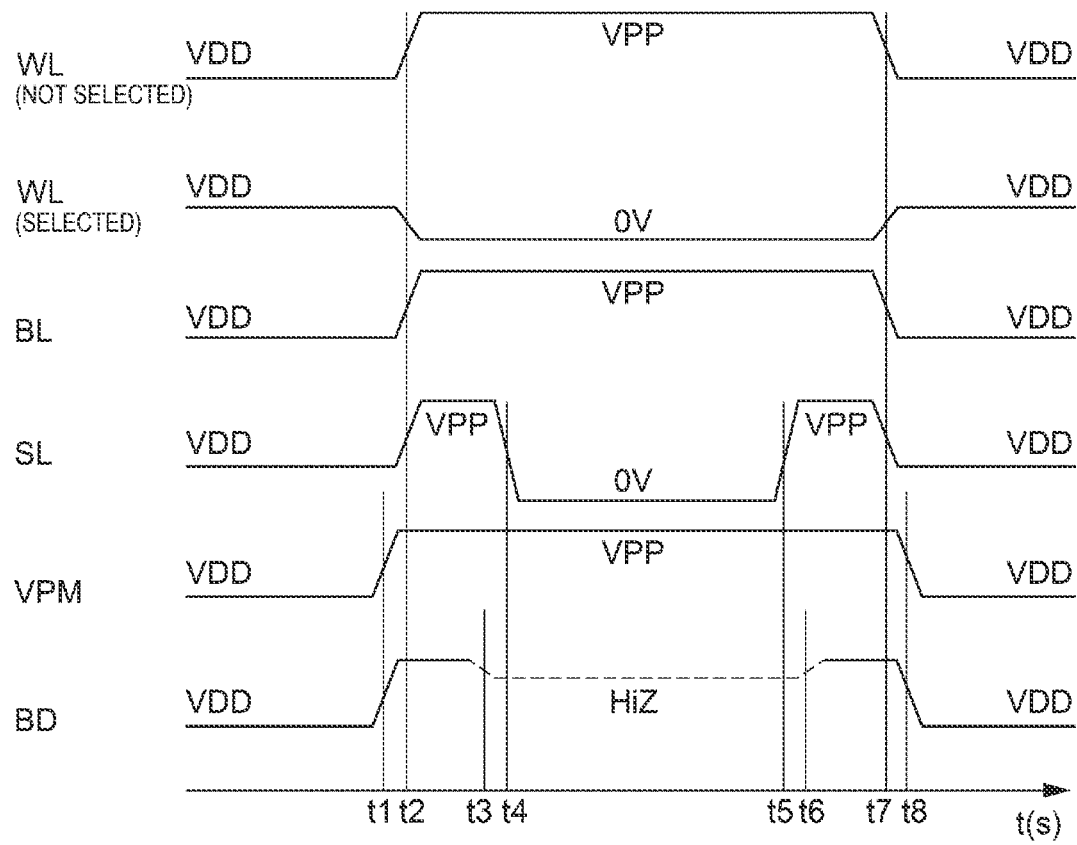

SEMICONDUCTOR STORAGE DEVICE AND ELECTRONIC APPARATUS

The present application is based on, and claims priority from JP Application Serial Number 2020-099179, filed Jun. 8, 2020, the disclosure of which is hereby incorporated by reference herein in its entirety.

BACKGROUND

1. Technical Field

The present disclosure relates to a semiconductor storage device and an electronic apparatus.

2. Related Art

JP-A-2019-96756 discloses a floating gate avalanche injection metal oxide semiconductor (FAMOS), which performs writing operation as a nonvolatile memory using a partially depleted silicon-on-insulator (PD-SOI) substrate by causing the potential of the body region of a floating gate transistor to be floating potential.

In the case of the technology disclosed in JP-A-2019-96756, however, when the potential at the body region of the selection transistor for cell selection is floating potential as the potential at the body region of the floating gate transistor is, the off-leakage current in the selection transistor is likely to cause writing disturbance in a non-selected cell.

SUMMARY

An aspect relates to a semiconductor storage device including a plurality of memory cells formed at a laminated substrate including a support layer, an insulating layer on the support layer, and a semiconductor layer on the insulating layer. The plurality of memory cells each include a floating gate transistor and a selection transistor. The floating gate transistor includes a first conductivity type first source region provided in the semiconductor layer, a first conductivity type first drain region provided in a region of the semiconductor layer that is a region separate from the first source region, a second conductivity type first body region provided in a region of the semiconductor layer that is a region sandwiched between the first source region and the first drain region, a second conductivity type first body contact region provided in a region of the semiconductor layer that is a region in contact with the first body region, a floating gate insulating film provided on the first body region, and a floating gate electrode provided on the floating gate insulating film. The selection transistor includes a first conductivity type second source region provided in the semiconductor layer and coupled to the first drain region, a first conductivity type second drain region provided in a region of the semiconductor layer that is a region separate from the second source region, a second conductivity type second body region provided in a region of the semiconductor layer that is a region sandwiched between the second source region and the second drain region, a second conductivity type second body contact region provided in a region of the semiconductor layer that is a region in contact with the second body region and insulated from the first body contact region, a selection gate insulating film provided on the second body region, and a selection gate electrode provided on the selection gate insulating film.

Another aspect relates to an electronic apparatus including the semiconductor storage device.

BRIEF DESCRIPTION OF THE DRAWINGS

FIG. 9 is a timing chart illustrating an example of writing operation.

FIG. 10 is a table illustrating potential at each portion in writing and readout modes.

DESCRIPTION OF EXEMPLARY EMBODIMENTS

Figure 1:
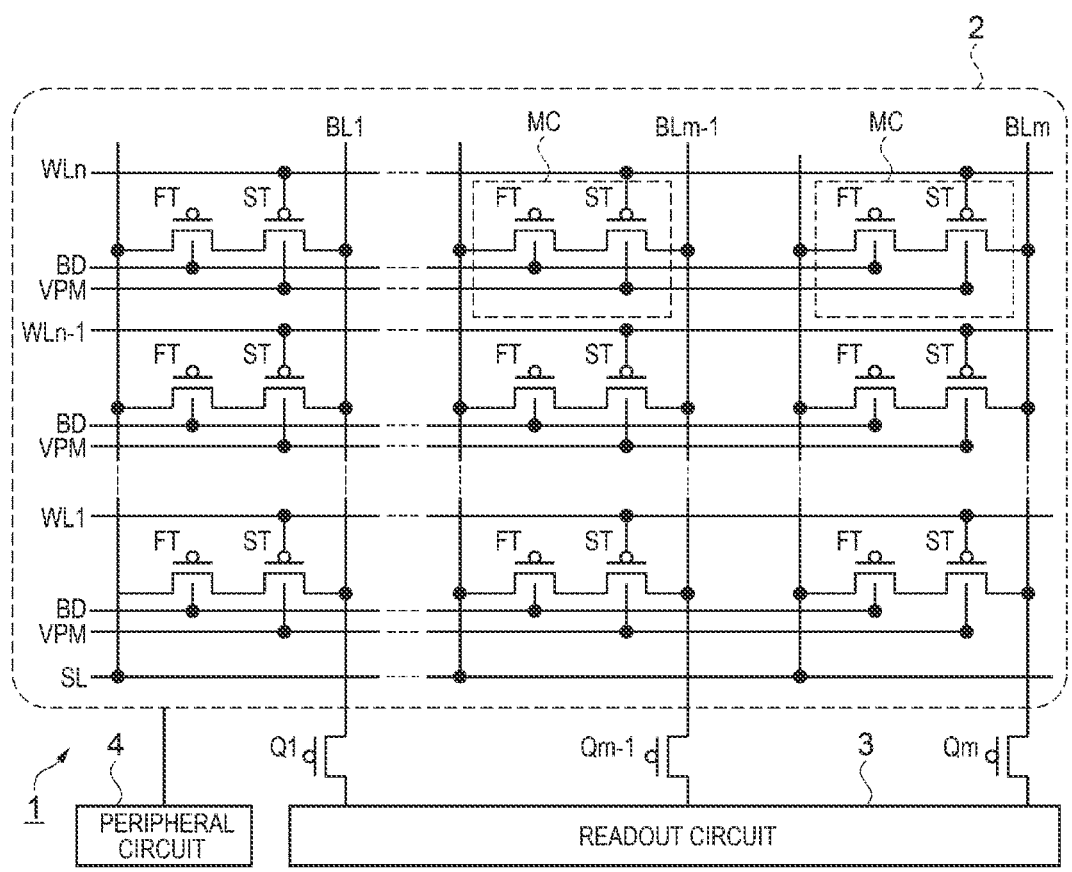
FIG. 1 is a circuit diagram illustrating a semiconductor storage device according to an embodiment.

An embodiment of the present disclosure will be described below with reference to the drawings. The embodiment illustrates an apparatus and method for embodying the technical idea of the present disclosure. The technical idea of the present disclosure does not limit the material, shape, structure, arrangement, and other factors of each constituent part to those described below. In the drawings, the same or similar elements have the same or similar reference characters, and no duplicate description thereof will be made. The drawings are so schematically drawn as to contain dimensions, relative dimensional proportions, arrangements, structures, and other factors different from those in the actual implementation.

It is noted that the definition of the vertical direction and other directions described below is merely a definition for convenience of explanation and does not limit the technical idea of the present disclosure. For example, when an observation target is rotated by 90° around the line of sight, it is, of course, appreciated that the upper and lower sides of the observation target are converted into the left and right sides thereof, and that when the observation target is rotated by 180° around the line of sight, the upper and lower sides and the left and right sides of the observation target are reversed. The technical idea of the present disclosure can be changed in a variety of manners within the technical scope set forth in the appended claims.

A semiconductor storage device 1 according to the embodiment includes a memory cell array 2 including a plurality of memory cells MC, a readout circuit 3, and a peripheral circuit 4, as shown in FIG. 1. The readout circuit 3 may include a sense amplifier, a logic circuit, and other components for reading data from the memory cell array 2. The peripheral circuit 4 may include a variety of driver circuits, a decoder circuit, and other components for performing writing or reading operation on the memory cell array 2.

The memory cell array 2 includes a plurality of memory cells MC selected via a plurality of bit lines BL1 to BLm arranged in a row direction and a plurality of word lines WL1 to WLn arranged in a column direction, where m and n are each a positive integer. In the example shown in FIG. 1, the plurality of memory cells MC are arranged in an m×n matrix. The plurality of bit lines BL1 to BLm in the memory cell array 2 are coupled to the readout circuit 3 via a plurality of column selection transistors Q1 to Qm corresponding to the bit lines BL1 to BLm. The column selection transistors Q1 to Qm are each a metal oxide semiconductor field effect transistor (MOSFET).

The plurality of memory cells MC each have a floating gate transistor FT and a selection transistor ST. The semiconductor storage device 1 is, for example, a FAMOS storage device including the floating gate transistors FT and the selection transistors ST, which are each a MOSFET. The sources of the floating gate transistors FT are coupled to a source line SL. The bodies of the floating gate transistors FT are coupled, for example, to first body lines BD. The drain of each of the floating gate transistors FT is coupled to the source of the selection transistor ST in the memory cell MC to which the floating gate transistor FT belongs.

The drain of each of the selection transistors ST is coupled to one of the bit lines BL1 to BLm in accordance with the position of the selection transistor ST in the memory cell array 2. For example, the drains of the selection transistors ST located in the same column in the memory cell array 2 are coupled to the same bit line BL. The gate of each of the selection transistors ST is coupled to one of the word lines WL1 to WLn in accordance with the position of the selection transistor ST in the memory cell array 2. For example, the gates of the selection transistors ST located in the same row in the memory cell array 2 are coupled to the same word line WL. The bodies of the selection transistors ST are coupled, for example, to second body lines VPM.

Figure 2:
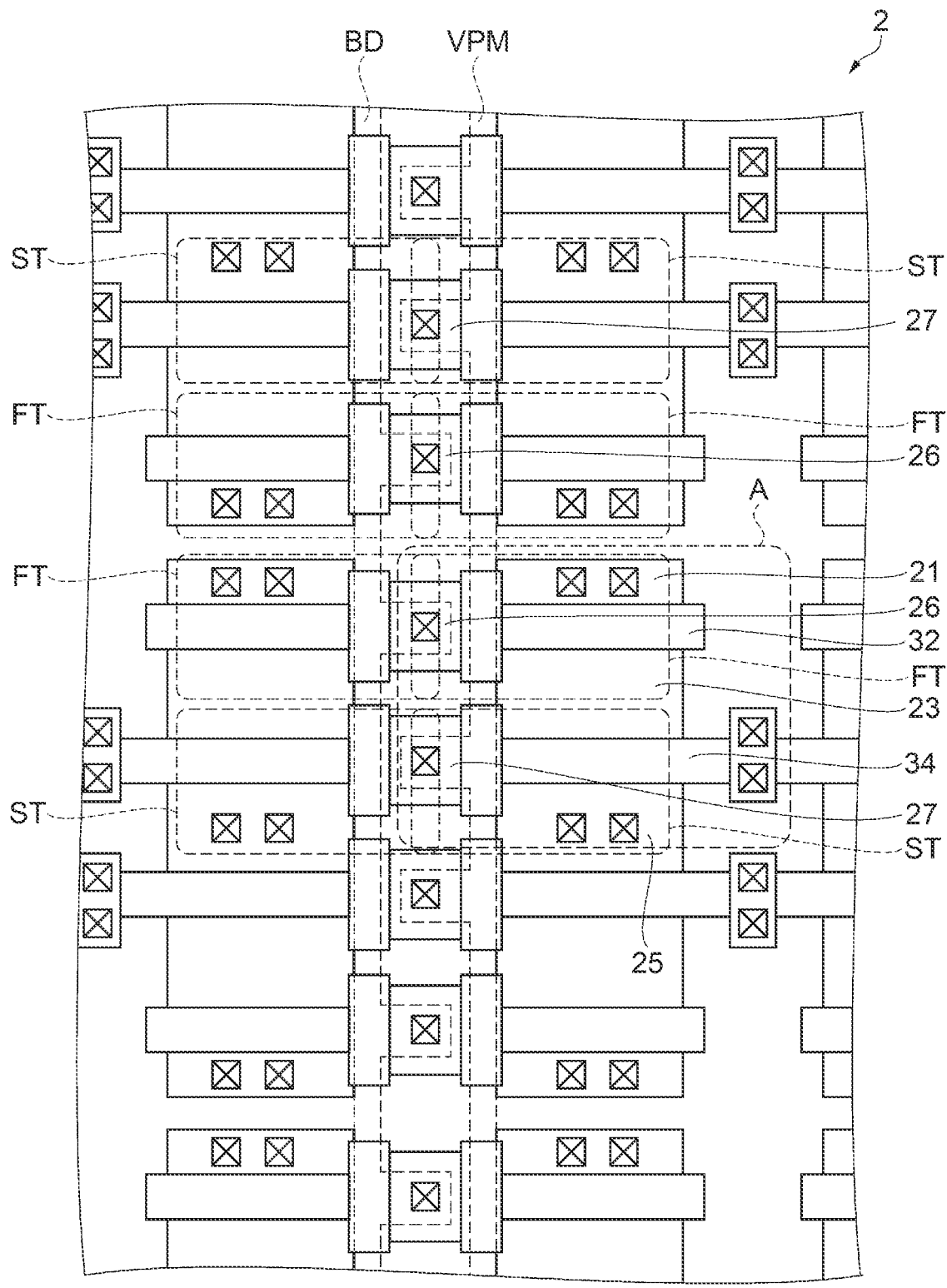
FIG. 2 is a plan view illustrating a memory cell array of the semiconductor storage device.

In the memory cell array 2, a plurality of sets each including a floating gate transistor FT and a selection transistor ST are arranged in a matrix, as shown in FIG. 2. In the example shown in FIG. 2, the range A corresponds to one memory cell MC shown in FIG. 1. In the present embodiment, a memory cell MC and another memory cell MC adjacent thereto in the row or column direction are mirror image symmetric with respect to each other. Adjacent memory cells MC can therefore share a same-potential region, whereby the memory cells MC can be accommodated per unit area with improved efficiency, and the wiring can be simplified. In the plan view of FIG. 2, a protective layer, a wiring layer on the protective layer, and other layers are omitted, and the range corresponding to part of the memory cell array 2 shown in FIG. 1 is selectively shown.

Figure 3:
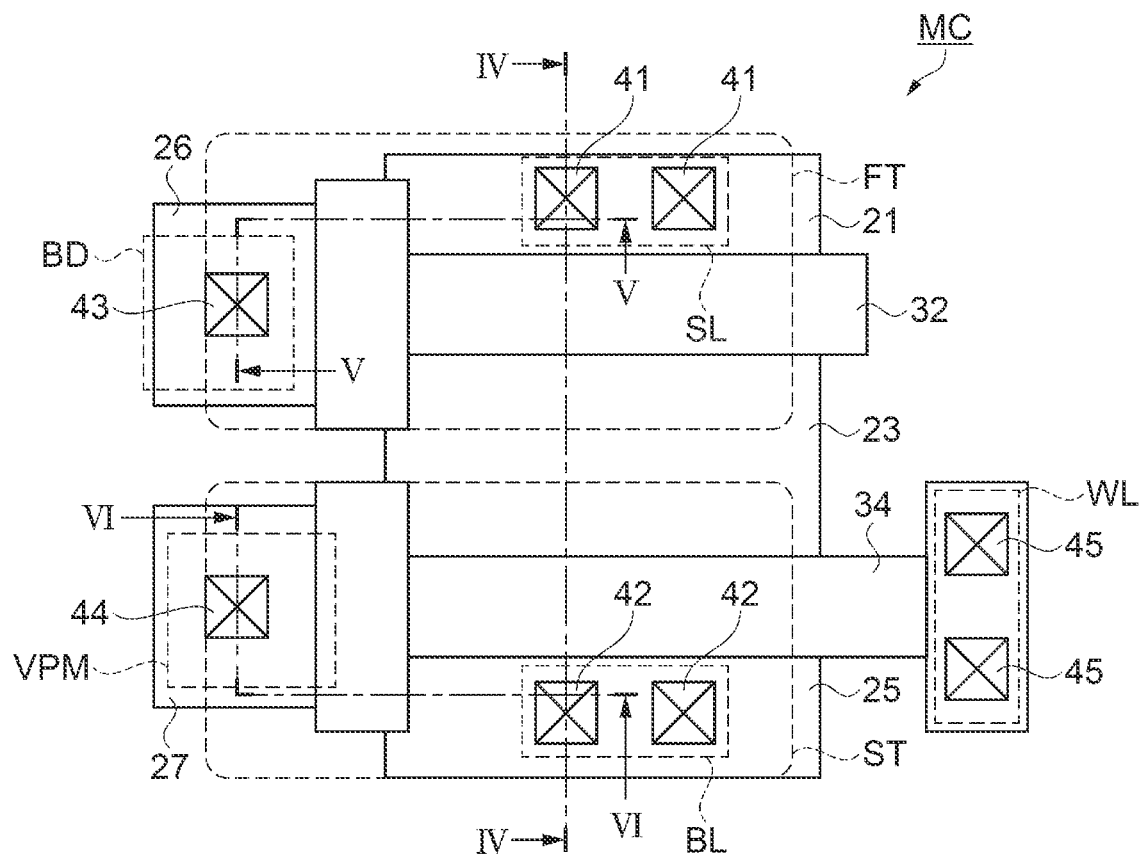
FIG. 3 is an enlarged plan view illustrating a range A in FIG. 2.
Figure 4:
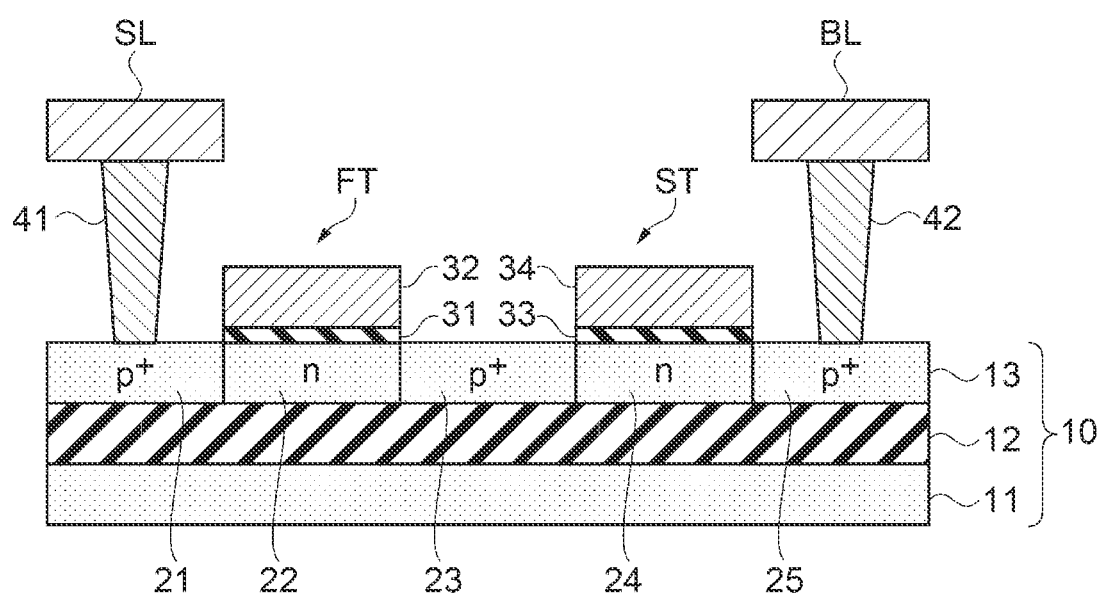
FIG. 4 is a cross-sectional view taken along the line IV-IV in FIG. 3.

The memory cells MC are formed at a laminated substrate 10 including a support layer 11, an insulating layer 12 on the support layer 11, and a semiconductor layer 13 on the insulating layer 12, as shown in FIGS. 3 and 4. The laminated substrate 10 is a silicon-on-insulator (SOI) substrate including a silicon substrate as the support layer 11, a silicon oxide film as the insulating layer 12, and a silicon active layer as the semiconductor layer 13. The memory cell array 2 is configured by forming a plurality of memory cells MC at the laminated substrate 10, which is a partially depleted SOI substrate.

Figure 5:
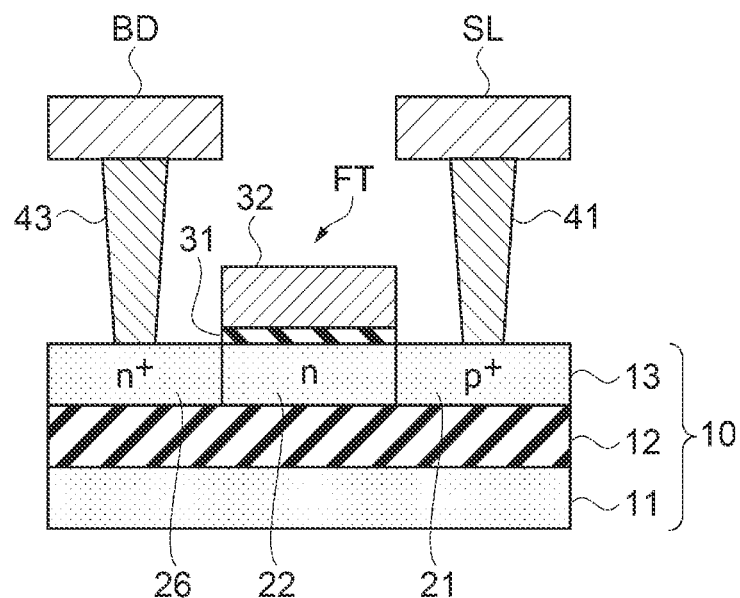
FIG. 5 is a cross-sectional view taken along the line V-V in FIG. 3.

The floating gate transistors FT each have a first conductivity type first source region 21, a first conductivity type first drain region, that is, a common region 23, a second conductivity type first body region 22, a second conductivity type first body contact region 26 having impurity density higher than that of the first body region 22, a floating gate insulating film 31, and a floating gate electrode 32, as shown in FIGS. 3 to 5. The first conductivity type and the second conductivity type are conductivity types opposite to each other. That is, when the first conductivity type is the p type, the second conductivity type is the n type.

The first source region 21 is selectively provided in the semiconductor layer 13. The first drain region, that is, the common region 23 is provided in a region of the semiconductor layer 13 that is a region separate from the first source region 21. The first body region 22 is provided in a region of the semiconductor layer 13 that is a region sandwiched between the first source region 21 and the first drain region. The first body contact region 26 is provided in a region in contact with the first body region 22 of the semiconductor layer 13. The floating gate insulating film 31 is provided on the first body region 22. The floating gate insulating film 31 is formed, for example, of a silicon oxide film. The floating gate electrode 32 is provided on the floating gate insulating film 31.

The first source region 21, the first body region 22, the common region 23, and the first body contact region 26 are each so provided as to start from the upper surface of the semiconductor layer 13 and reach the lower surface thereof. For example, the floating gate electrode 32 has a T-letter-shaped planar pattern. The first body region 22 located below the floating gate electrode 32 has the same T-letter-shaped planar pattern as that of the floating gate electrode 32.

Figure 6:
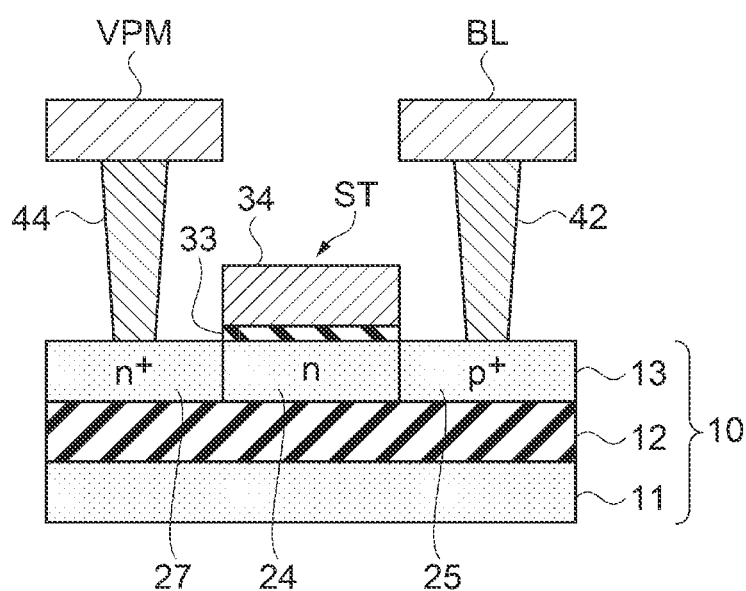
FIG. 6 is a cross-sectional view taken along the line VI-VI in FIG. 3.

The selection transistors ST each have a first conductivity type second source region, that is, the common region 23, a first conductivity type second drain region 25, a second conductivity type second body region 24, a second conductivity type second body contact region 27 having impurity density higher than that of the second body region 24, a selection gate insulating film 33, and a selection gate electrode 34, as shown in FIGS. 3, 4, and 6. The second source region is selectively provided in the semiconductor layer 13 and electrically coupled to the first drain region. In the present embodiment, the first drain region of the floating gate transistor FT and the second source region of the selection transistor ST are integrally provided as the common region 23 at the semiconductor layer 13.

The second drain region 25 is provided in a region separate from the second source region, that is, the common region 23 of the semiconductor layer 13. The second body region 24 is provided in a region of the semiconductor layer 13 that is a region sandwiched between the second source region and the second drain region 25. The second body contact region 27 is provided in a region of the semiconductor layer 13 that is a region in contact with the second body region 24 and insulated from the first body contact region 26. The selection gate insulating film 33 is provided on the second body region 24. The selection gate insulating film 33 is formed, for example, of a silicon oxide film. The selection gate electrode 34 is provided on the selection gate insulating film 33.

The second drain region 25, the second body region 24, and the second body contact region 27 are each so provided as to start from the upper surface of the semiconductor layer 13 and reach the lower surface thereof. For example, the selection gate electrode 34 has a substantially T-letter-shaped planar pattern. The second body region 24 located below the selection gate electrode 34 has the same T-letter-shaped planar pattern as that of the selection gate electrode 34.

The memory cell array 2 includes an element separation insulating film formed by a LOCOS (LOCal Oxidation of Silicon) method or an STI (Shallow Trench Isolation) method and located at a peripheral portion of each of the floating gate transistors FT and the selection transistors ST. The outer edge of the memory cell MC in FIG. 3 corresponds to the boundary of the element separation insulating film. However, the second drain region 25, the first body contact region 26, the second body contact region 27, and other regions shared by another adjacent memory cell MC are not separate from the other memory cell MC by the element separation insulating film. The first body contact region 26 and the second body contact region 27 are insulated from each other by the element separation insulating film.

The first source region 21 is coupled to the source line SL via first contact plugs 41. The second drain region 25 is coupled to a bit line BL via second contact plugs 42. The first body contact region 26 is coupled to a first body line BD via a third contact plug 43. The second body contact region 27 is coupled to a second body line VPM via a fourth contact plug 44. The selection gate electrode 34 is coupled to a word line WL via fifth contact plugs 45.

Figure 7:
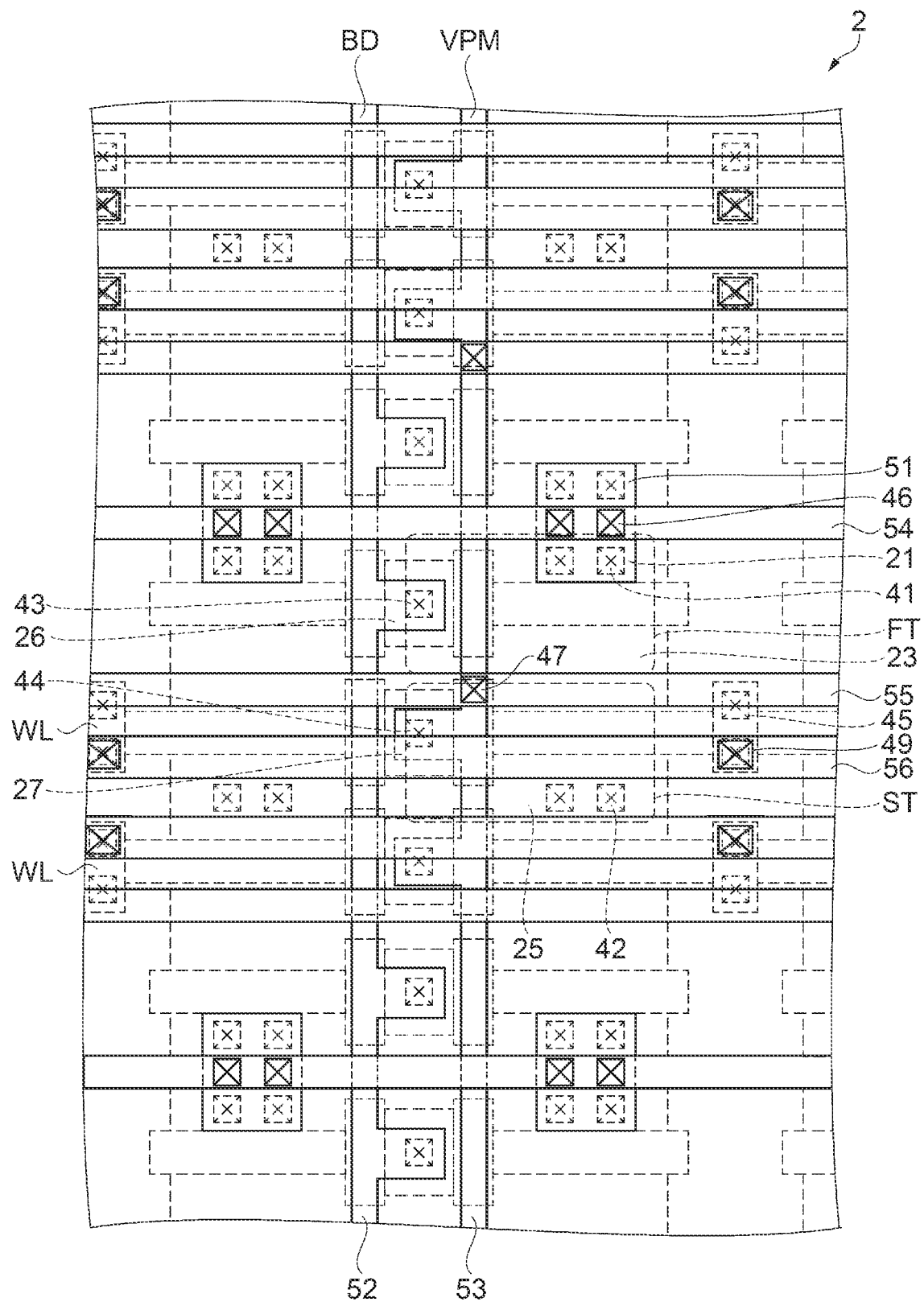
FIG. 7 is a plan view illustrating first and second wiring layers on memory cells.

The first body lines BD each include a first body wiring line 52 formed of a first wiring layer, as shown in FIG. 7. The second body lines VPM each include a second body wiring line 53 formed of the same first wiring layer as that of the first body wiring line 52. The first wiring layer is the lowest wiring layer of a metal wiring layer laminated on the plurality of memory cells MC. In addition, the first wiring layer forms first source wiring lines 51, which function as part of the source line SL.

The first source wiring line 51 are coupled to second source wiring lines 54 formed of a second wiring layer via sixth contact plugs 46. The second wiring layer is a metal wiring layer laminated on the first wiring layer via an insulating film that is not shown. The second body wiring lines 53 are coupled to third body wiring lines 55 formed of the second wiring layer via seventh contact plugs 47. In addition, the second wiring layer is coupled to the fifth contact plugs 45 coupled to the selection gate electrodes 34 to form word wiring lines 56, which function as part of the word lines WL. The word wiring lines 56 are coupled to the fifth contact plugs 45 via ninth contact plugs 49 and the first wiring layer.

Figure 8:
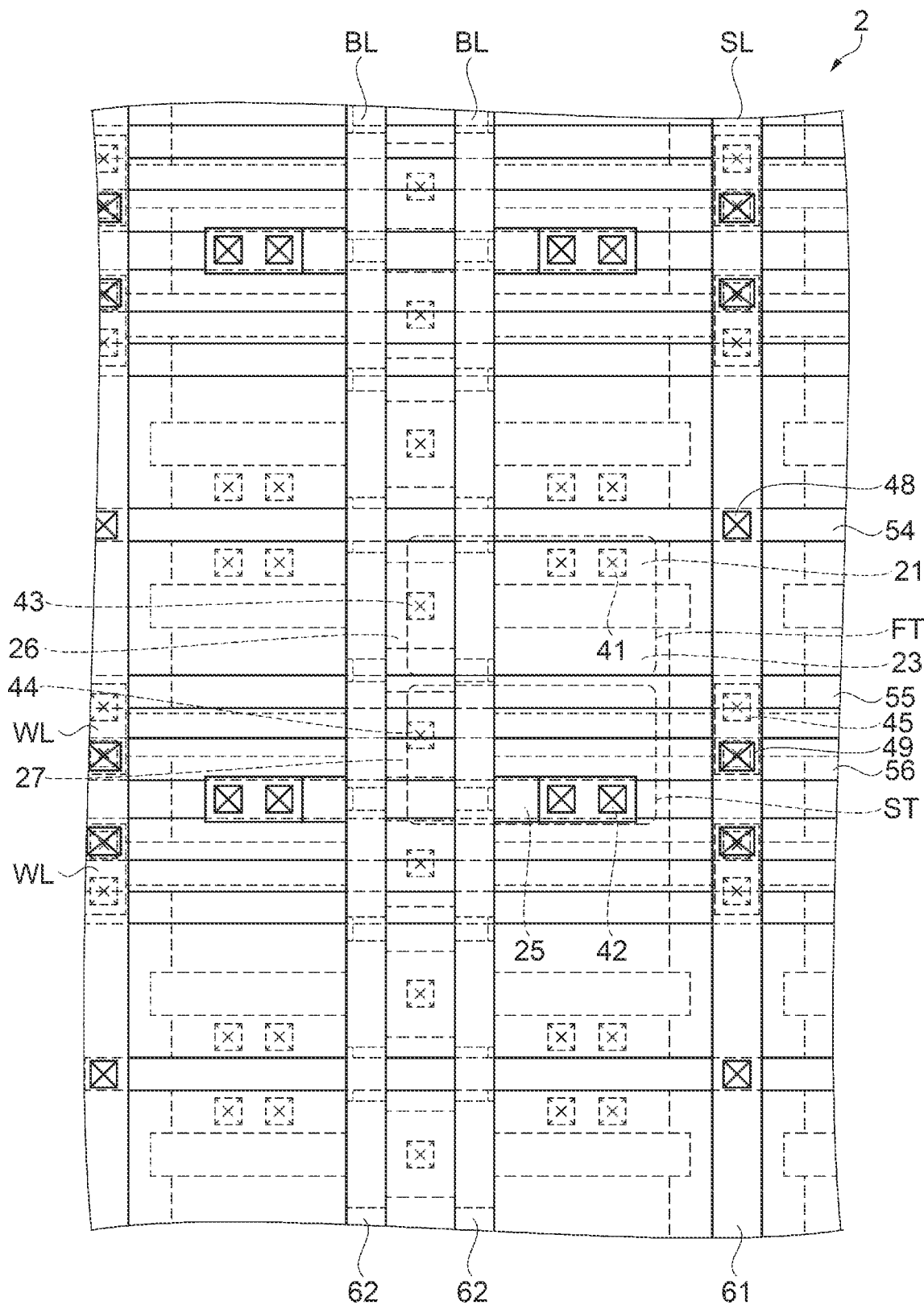
FIG. 8 is a plan view illustrating the second wiring layer and a third wiring layer on the memory cells.

The second source wiring lines 54 are coupled to a third source wiring line 61 formed of a third wiring layer via eighth contact plugs 48, as shown in FIG. 8. That is, the first source wiring lines 51, the second source wiring lines 54, and the third source wiring line 61 function as the source line SL. The third wiring layer is a metal wiring layer laminated on the second wiring layer via an insulating film that is not shown. In addition, the third wiring layer forms bit wiring lines 62 coupled to the second drain region 25 via the second contact plugs 42. The bit wiring lines 62 function as the bit lines BL.

As described above, the first body lines BD and the second body lines VPM are configured by using the wiring layers different from the source line SL, the bit lines BL, and the word lines WL. The source line SL, the bit lines BL, and the word lines WL are primarily formed of the second wiring layer and the third wiring layer. The source line SL, the bit lines BL, and the word lines WL, which extend over taps disposed at the periphery of the memory cell array 2, are formed of the wiring layers different from the first body lines BD and the second body lines VPM, whereby the wiring lines are readily laid out.

An example of the writing operation in the semiconductor storage device 1 will be described with reference to the timing chart of FIG. 9. First, at time t1, the potential at each of a first body line BD and a second body line VPM increases from VDD to VPP. That is, the potential at each of the first body region 22 and the second body region 24 is set at VPP. VDD and VPP are each fixed potential determined in advance. VDD is, for example, about 2V. VPP ranges, for example, from about 5 to 6V.

At time t2, the potential at unselected word lines WL increases from VDD to VPP, and the potential at a selected word line WL decreases from VDD to 0 V. The potential at a selected bit line BL and the potential at the source line SL increase from VDD to VPP. The writing operation in the semiconductor storage device 1 thus starts. At time t3, the potential at the first body line BD is changed from VPP to HiZ, that is, set at floating potential.

At time t4, the potential at the source line SL decreases from VPP to 0 V. The writing operation performed on the selected memory cell MC thus starts. At time t5, the potential at the source line SL increases from 0 V to VPP. The writing operation performed on the selected memory cell MC thus ends. At time t6, the potential at the first body line BD is changed from the floating potential to VPP.

At time t7, the potential at the unselected word lines WL decreases from VPP to VDD, and the potential at the selected word line WL increases from 0 V to VDD. At the same time, the potential at the selected bit line BL and the potential at the source line SL decrease from VPP to VDD. The writing operation in the semiconductor storage device 1 thus ends. At time t8, the potential at each of the first body line BD and the second body line VPM decreases from VPP to VDD. In the writing operation, the potential at the second body line VPM only needs to be higher than or equal to the potential at the selected bit line BL, that is, the second drain region 25. That is, the potential at the second body line VPM may be higher than the potential at the second drain region 25.

The time t1, at which the potential at each of the first body line BD and the second body line VPM rises, may coincide with the time t2. Similarly, the time t8, at which the potential at each of the first body line BD and the second body line VPM falls, may coincide with the time t7. Further, the period from the time t3, at which the potential at the first body line BD becomes floating potential, to the time t6 may coincide with the period from the time t4 to the time t5 or may fall within the period from the time t4 to the time t5.

If the potential at the body of the floating gate transistor FT is fixed, it is in some cases difficult to perform the writing operation by using low writing voltage. On the other hand, there has been a proposed method for setting the potential at the body of the floating gate transistor FT at floating potential. In the method of related art, however, since the body of the floating gate transistor FT and the body of the selection transistor ST have the same potential, off-leakage current in the selection transistor ST increases, and writing disturbance may undesirably occur in the non-selected memory cells MC.

In the semiconductor storage device 1 according to the present embodiment, in which the first body region 22 and the second body region 24 are insulated from each other, the potential at the two regions can be separately set via the first body contact region 26 and the second body contact region 27. Therefore, even when the writing voltage is set at a low value, writing disturbance (erroneous writing) in the non-selected memory cells MC can be suppressed.

In the readout operation, the potential at each of the first body line BD and the second body line VPM is set at VDD, as shown in FIG. 10. When the potential at the first body line BD is HiZ, erroneous writing may occur in an unintended memory cell MC at the time of readout, and setting the potential at VDD can prevent the erroneous writing. The potential at the selected word line WL is set at 0 V, and the potential at each of the non-selected word lines WL and the source line SL is set at VDD. The potential at the selected bit line BL is set at detected potential Sense, and the potential at the non-selected bit lines BL is set at HiZ.

Figure 11:
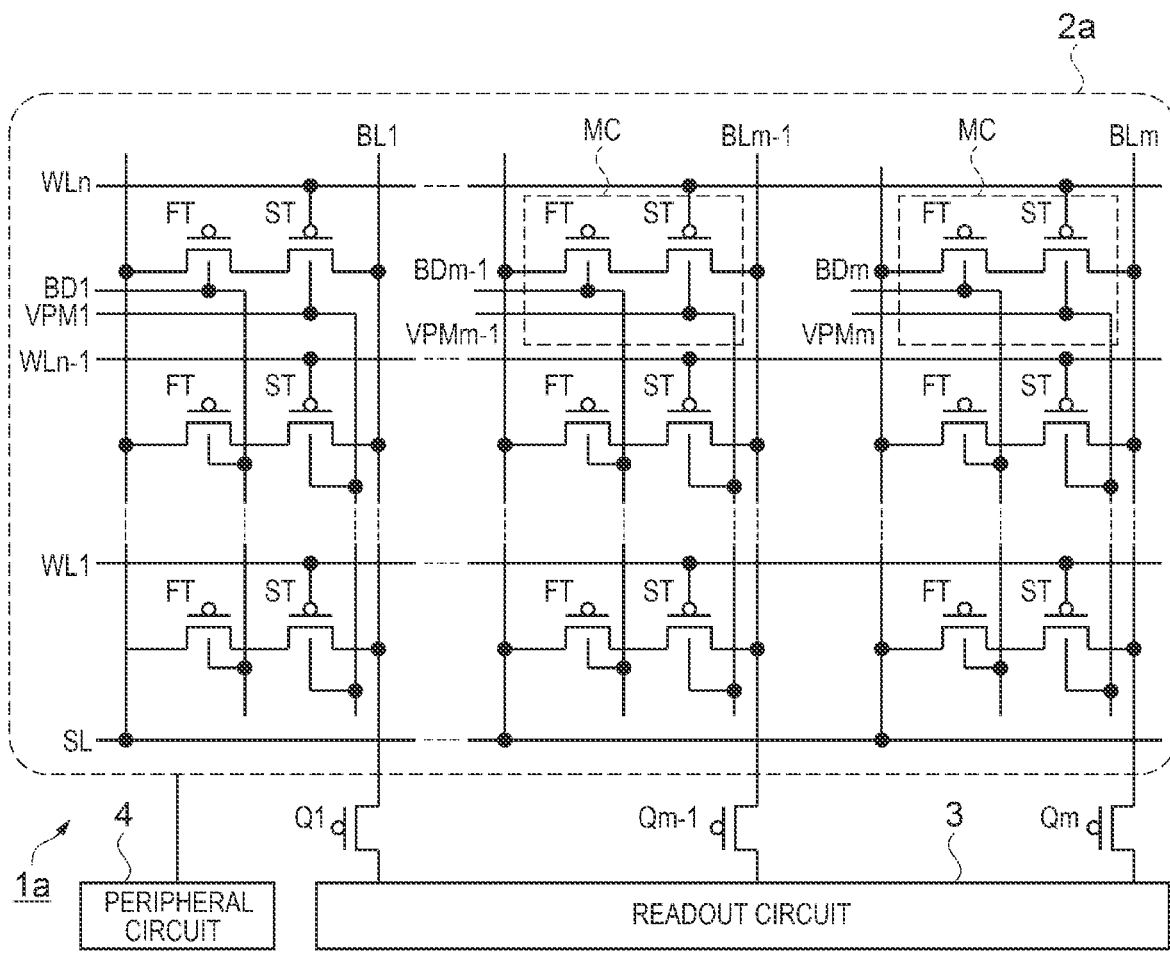
FIG. 11 is a circuit diagram illustrating the semiconductor storage device according to a first variation of the embodiment.

A semiconductor storage device 1a according to a first variation of the embodiment differs from the semiconductor storage device 1 according to the embodiment described above in that the potential at each of the first body line BD and the second body line VPM can be individually set on a column basis, as shown in FIG. 11. That is, a memory cell array 2a of the semiconductor storage device 1a includes a plurality of first body lines BD1 to BDm and a plurality of second body lines VPM1 to VPMm. The potential at each of the first body line BD and the second body line VPM can therefore be set only at a selected column.

Figure 12:
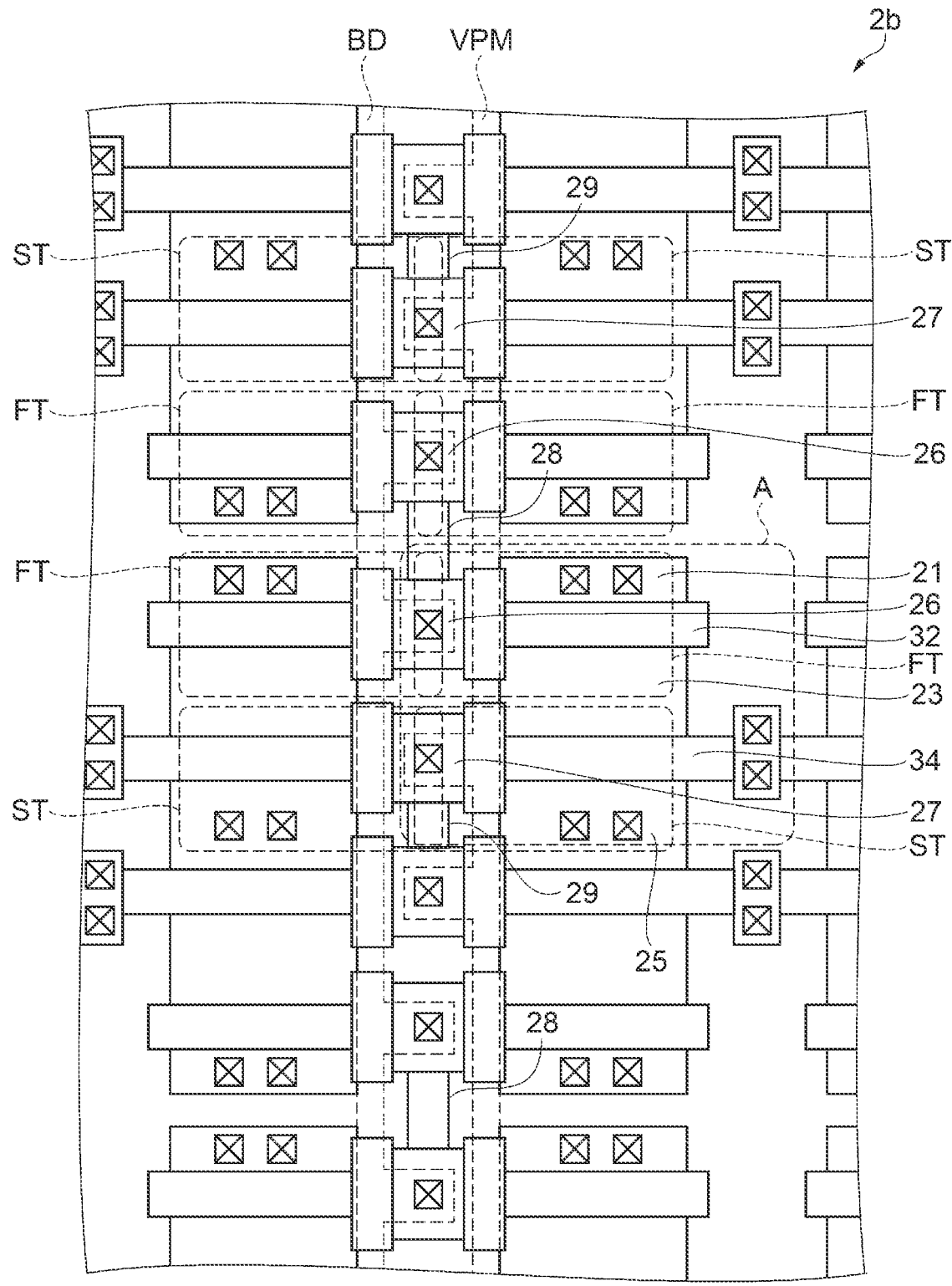
FIG. 12 is a plan view illustrating the memory cell array according to a second variation of the embodiment.

A memory cell array 2b according to a second variation of the embodiment further includes a second conductivity type first connection region 28, which couples adjacent first body contact regions 26 to each other, and a second conductivity type second connection region 29, which couples adjacent second body contact regions 27 to each other, as shown in FIG. 12. Therefore, even when contact abnormality occurs in any of the adjacent body contact regions, the potential can be set from the other body contact region via the first connection region 28 or the second connection region 29.

The embodiment has been described above, but the present disclosure is not limited to the disclosed embodiment. The configuration of each portion may be replaced with an arbitrary configuration having the same function, and an arbitrary configuration in the embodiment may be omitted or added within the technical scope of the present disclosure. The disclosure of such replacement, omission, and addition thus allows a person skilled in the art to conceive of a variety of alternative embodiments.

Figure 13:
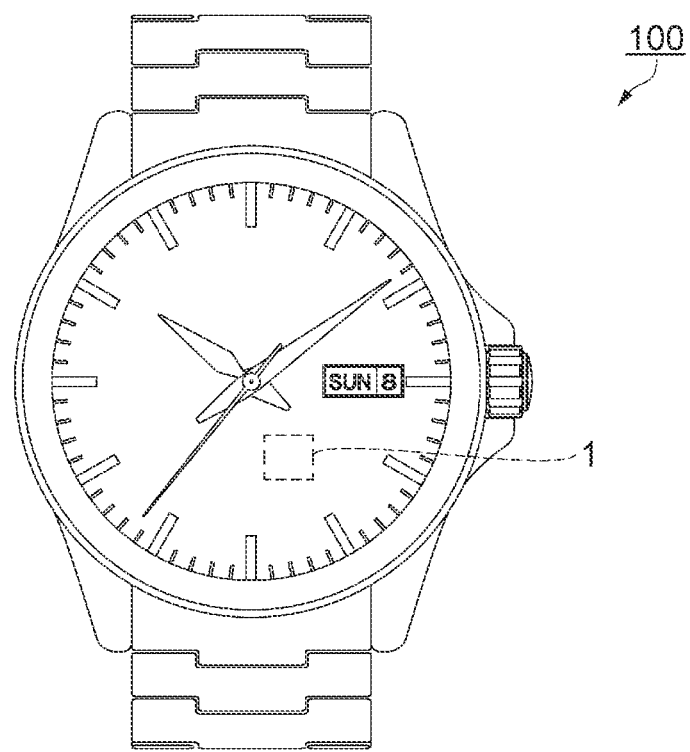
FIG. 13 illustrates an example of an electronic apparatus including the semiconductor storage device according to the embodiment.

For example, the semiconductor storage device 1 described above can be employed as a nonvolatile storage device in an electronic apparatus 100, such as an electronic timepiece, as shown in FIG. 13. That is, providing the semiconductor storage device 1, which allows the writing operation at low voltage and has a low possibility of causing writing disturbance, improves the reliability of the apparatus.

In addition to the above, the present disclosure, of course, encompasses a variety of embodiments that are not described above, such as a configuration to which the configurations described above are mutually applied. The technical scope of the present disclosure is specified only by the inventive specific items according to the appended claims that are reasonably derived from the above description.

What is claimed is:

1. A semiconductor storage device comprising:
   a plurality of memory cells formed at a laminated substrate including a support layer;
   an insulating layer on the support layer; and
   a semiconductor layer on the insulating layer,
   wherein the plurality of memory cells each include a floating gate transistor and a selection transistor,
   the floating gate transistor includes:
      a first conductivity type first source region provided in the semiconductor layer;
      a first conductivity type first drain region provided in a region of the semiconductor layer that is separate from the first conductivity type first source region;
      a second conductivity type first body region provided in a region of the semiconductor layer that is sandwiched between the first conductivity type first source region and the first conductivity type first drain region;
      a second conductivity type first body contact region provided in a region of the semiconductor layer that is in contact with the second conductivity type first body region;
      a floating gate insulating film provided on the second conductivity type first body region; and
      a floating gate electrode provided on the floating gate insulating film, and
   the selection transistor includes:
      a first conductivity type second source region provided in the semiconductor layer and coupled to the first conductivity type first drain region;
      a first conductivity type second drain region provided in a region of the semiconductor layer that is separate from the first conductivity type second source region;
      a second conductivity type second body region provided in a region of the semiconductor layer that is sandwiched between the first conductivity type second source region and the first conductivity type second drain region;
      a second conductivity type second body contact region provided in a region of the semiconductor layer that is in contact with the second conductivity type second body region and insulated from the second conductivity type first body contact region;
      a selection gate insulating film provided on the second conductivity type second body region; and
      a selection gate electrode provided on the selection gate insulating film.

2. The semiconductor storage device according to claim 1, wherein in a writing operation, a potential at the second conductivity type first body region is set at a floating potential, and a potential at the second conductivity type second body region is set at a fixed potential.

3. The semiconductor storage device according to claim 2, wherein the fixed potential is higher than a potential at the first conductivity type second drain region.

4. The semiconductor storage device according to claim 2, wherein the potential at the second conductivity type first body region is set at the fixed potential and then set at the floating potential.

5. The semiconductor storage device according to claim 1, further comprising:
   a first body line coupled to the second conductivity type first body contact region;
   a second body line coupled to the second conductivity type second body contact region;
   a source line coupled to the first conductivity type first source region;
   a bit line coupled to the first conductivity type second drain region; and a word line coupled to the selection gate electrode,
wherein the first body line and the second body line are configured by using a wiring layer different from the source line, the bit line, and the word line.

6. The semiconductor storage device according to claim 1, wherein one of the plurality of memory cells and another adjacent memory cell are mirror image symmetric with respect to each other.

7. An electronic apparatus comprising the semiconductor storage device according to claim 1.

* * * * *